United States Patent [19]

Yamada et al.

[11] Patent Number: 4,558,395
[45] Date of Patent: Dec. 10, 1985

[54] COOLING MODULE FOR INTEGRATED CIRCUIT CHIPS

[75] Inventors: Minoru Yamada, Iruma; Akira Masaki, Tokyo; Masakazu Yamamoto; Keiichirou Nakanishi, both of Kokubunji; Takashi Nishida, Tokyo; Takahiro Daikoku, Ibaraki; Fumiyuki Kobayashi, Sagamihara; Kuninori Imai, Kanagawa, all of Japan

[73] Assignee: Hitachi, Ltd., Tokyo, Japan

[21] Appl. No.: 604,003

[22] Filed: Apr. 26, 1984

[30] Foreign Application Priority Data

Apr. 27, 1983 [JP] Japan ................................ 58-72896

[51] Int. Cl.$^4$ ............................................. H05K 7/20
[52] U.S. Cl. ..................................... 361/385; 361/386
[58] Field of Search ................ 357/81, 82; 165/80 R, 165/80 C; 174/15 R; 361/382-384, 385, 386, 387, 388

[56] References Cited

U.S. PATENT DOCUMENTS

| | | | |
|---|---|---|---|
| 3,481,393 | 12/1969 | Chu | 361/385 |
| 4,109,707 | 8/1978 | Wilson | 361/385 |
| 4,245,273 | 1/1981 | Feinbert | 361/382 |
| 4,381,032 | 4/1983 | Cutchaw | 361/385 |

OTHER PUBLICATIONS

"Silicon Heat Sink . . . ", Ahearn, IBM Tech. Discl. Bull., vol. 21, No. 8, Jan. 79, pp. 3378, 3379.

*Primary Examiner*—G. P. Tolin
*Attorney, Agent, or Firm*—Antonelli, Terry & Wands

[57] ABSTRACT

A cooling module for integrated circuit chips comprising a plurality of integrated circuit chips mounted on a wiring substrate, cooling members respectively provided for integrated circuit chips, each of the cooling members having therein space for circulating the coolant, and flexible pipes connected to respective cooling members, the coolant being caused to flow into or out of said space of said cooling member through the flexible pipes in order to remove heat from the integrated circuit chip.

17 Claims, 5 Drawing Figures

COOLING MODULE FOR INTEGRATED CIRCUIT CHIPS

BACKGROUND OF THE INVENTION

The present invention relates to a cooling module for integrated circuit chips and in particular to a cooling unit of a multichip module for effectively removing heat generated by a plurality of integrated circuit chips having high power dissipation mounted on a wiring substrate.

An example of a cooling structure of a multichip module comprising a plurality of integrated circuit chips mounted on a wiring substrate is disclosed in U.S. Pat. No. 4,245,273 issued to Feinbert et al. on Jan. 13, 1981. Such a structure has two gaps in the thermal conduction path extending from an integrated circuit chip to a coolant. One of the gaps is located between the integrated circuit chip and the piston. The other of the gaps is located between the piston and the housing. The thermal conduction across these gaps cannot but rely upon gas in the gaps having an extremely low thermal conductivity. Since a large confronting area is required between the piston and the housing, the length of the piston cannot be reduced, resulting in a long thermal conduction path. As a result, there is a limit to reduction of the thermal resistance between the chip and the coolant.

SUMMARY OF THE INVENTION

An object of the present invention is to provide a cooling module for integrated circuit chips which efficiently cools a plurality of integrated circuit chips having high power dissipation.

Another object of the present invention is to provide a cooling module for integrated circuit chips having a cooling efficiency which is not influenced by unevenness in height of chips necessarily brought about during manufacturing.

Still another object of the present invention is to provide a cooling module for integrated circuit chips wherein a defective integrated circuit chip can be easily replaced.

For attaining the above described objects, in accordance with the present invention, a cooling member having space therein for circulating appropriate coolant fluid is provided for each integrated circuit chip, and flexible pipes are connected to respective cooling members to cause the coolant to flow into and out of the cooling members.

DESCRIPTION OF THE PREFERRED EMBODIMENTS

Figure 1:
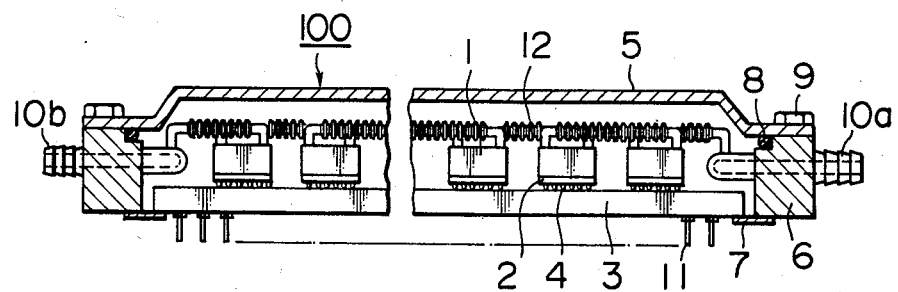
FIG. 1 is a sectional view for illustrating an embodiment of the present invention.
Figure 2:
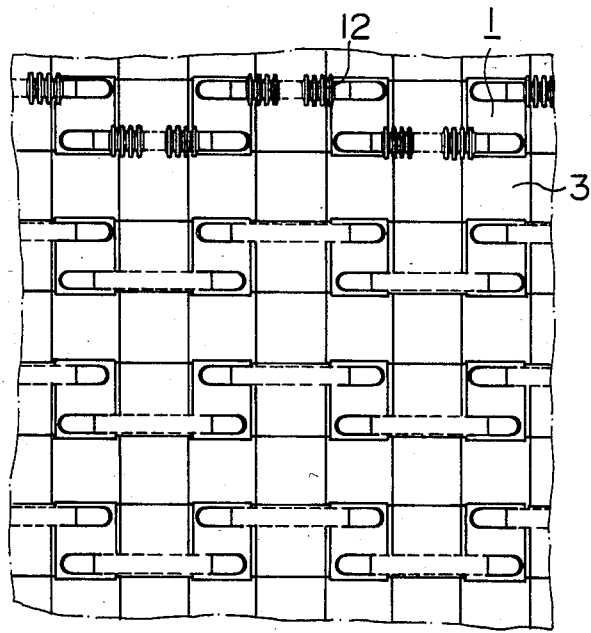
FIG. 2 is a plan view for illustrating the arrangement of cooling members and pipes in the embodiment illustrated in FIG. 1.

FIG. 1 is a sectional view for illustrating an embodiment of the present invention. FIG. 2 is a plan view for illustrating an arrangement of cooling members and pipes in the embodiment illustrated in FIG. 1.

A multichip module 100 functions to enclose a number of integrated circuit chips 2 mounted on the surface of a substrate 3 and to cool them. The substrate 3 has a number of module pins 11 for connecting the module to a circuit card or a circuit board. On the internal surface of the substrate 3, a number of integrated circuit chips 2 are mounted via soldering terminals 4 in a matrix form. An integrated circuit chip 2 is electrically connected to another chip or the module pin 11 through wiring layers which are formed on the surface of the substrate 3 or inside thereof and which are not illustrated in FIG. 1. A flange 7 is attached to the bottom surfaces of the wiring substrate 3 and of a housing 6 by using a technique such as brazing to hermetically seal a gap between the substrate 3 and the housing 6. A cap 5 is screwed to the housing 6 with an O-ring 8 inserted between them by a screw 9 to hermetically seal the whole structure of the multichip module 100. For causing coolant such as water to flow into or out of the module, nozzles 10a and 10b are provided in the housing 6. A cooling member 1 is attached to the back of each integrated circuit chip 2 to cool the chip 2. In order to cause the coolant to flow into or out of each cooling member, cooling members are connected together through flexible pipes (bellows) 12.

Figure 3:
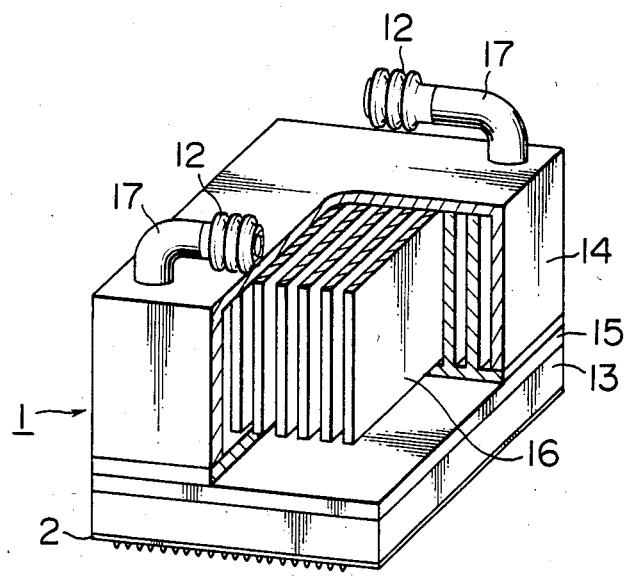
FIG. 3 is a partly broken oblique view of a cooling member.

The heat generated by the integrated circuit chip 2 is conducted from the chip 2 to the cooling member 1 and cooled by the coolant circulating through the cooling member. The coolant supplied from the outside of the module is caused to flow into the module through the nozzle 10a. Then the coolant circulates successively through cooling members arranged in the row or column direction via the bellows 12. Finally, the coolant flows to the outside of the module through the nozzle 10b. Chips and cooling members are arranged in a matrix form as illustrated in FIG. 2. And cooling members arranged in the row direction, for example, are connected in series by the bellows 12. Fins are provided inside each cooling member 1 as described later. The fins are arranged so that the groove will make a right angle with the extension direction of the bellows 12. In this embodiment, the coolant input port and the coolant output port of each cooling member are provided on its diagonal line. Cooling members are successively arranged in the row direction so that the output port of a cooling member may confront the input port provided in the opposite corner of its adjacent cooling member. The output port of a cooling member is connected to the input port of its adjacent cooling member via the bellows 12. As a result, the bellows are considerably long. Accordingly, the bellows are designed to have increased flexibility. FIG. 3 is a broken oblique view of the cooling member. The cooling member 1 includes a cooling block 14 having fins 16 therein and having space for causing the coolant to flow between those fins. The cooling block 14 is made of a material, such as copper, which has a high thermal conductivity and is easily workable. The fins 16 may be formed as a part of the cooling block 14, or may be formed integrally with the upper cover or lower cover as shown in FIG. 3 of the cooling block 14 and then may be fixed to the bottom face or the internal face of the upper cover as shown in FIG. 3 of the cooling block, respectively by using the brazing technique or the like. On the upper surface of the cooling block 14, a pair of pipes 17 for causing the coolant to flow into or out of the inside of the block are provided. The pipes 17 are made of metal such as copper and are fixed to the cooling block by brazing or the like. The pipes are coupled to the sufficiently flexible bellows 12 of a flexible material such as copper or nickel to couple cooling blocks together. The coupling may be performed by brazing or fastening with a ring-shaped metal fitting made of a shape memory alloy. Such coupling methods facilitate connection or disconnection of the bellows. A preferred shape memory alloy is made of an alloy of Ti and Ni and has a critical temperature ($M_f$ point) at which the Martensite transformation finishes and which is lower than the lower limit (e.g., 0° C.) of the environmental temperature. The shape memory alloy is described in detail, for example, in Japanese journal "Plasticity and processing", Vol. 22, No. 246, pp. 645–653, July 1981. In addition, an insulator 13 is fixed to the exterior bottom surface of the cooling block 14 through a binding layer 15 composed of solder or the like. The insulator 13 is made of an electrically insulating material having a high thermal conductivity and a thermal expansion coefficient which nearly matches the thermal expansion coefficient of the integrated circuit chip. For example, the material of the insulator 13 may be silicon carbide such as Hitaceram SC-101 (registered trademark owned by Hitachi). Especially when the integrated circuit chip 2 is a silicon chip, the thermal expansion coefficient of the above described silicon carbide having a high electric insulation and a high thermal conductivity is nearly equal to that of the chip. The bottom surface of the insulator 13 is bound to the back surface of the integrated circuit chip by means of soldering or the like.

As evident from the above description, the thermal conduction path is short and is made of a material having a high thermal conductivity. As a result, the thermal resistance can be extremely lowered.

A practical numerical example is described below. In the example, a cooling block made of copper and an insulator made of Hitaceram (registered trademark) SC-101 were employed. The coolant was water having a flow rate of 10 cc/sec. The bottom surface of the cooling block was 10 mm square. The thickness, height and spacing of the fins were chosen to be 200 $\mu$m, 2 mm and 200 $\mu$m, respectively. Thus, the thermal resistance between the chip and the coolant was as low as approximately 1° C./W. The power dissipation of the chip as large as approximately 50 W was permissible. The thickness of the insulator 13 may be 0.1 to 5 mm. For the thickness varied over this range, the thermal resistance exhibits little variation.

Even if the integrated circuit chips 2 are uneven in height or are tilted due to the warp of the wiring substrate 3 or unevenness of the soldering terminals 4 in height, the unevenness in height or the tilt can be absorbed by the expansion and contraction of the bellows 12, variation in thermal resistance being effectively prevented.

When a chip becomes defective, the cooling member 1 can be removed by locally heating and melting solder between the chip 2 and the insulator 13. Thus, the defective chip can be easily replaced by a new one.

In addition, electrical insulation of chip 2 from the cooling block 14 by means of the insulator 13 ensures the normal operation of the circuit included in the chip. Especially in case of a silicon chip, the thermal stress applied to the chip can be reduced as compared with that in the absence of the insulator because the thermal expansion coefficient of the chip is nearly equal to that of the insulator.

In addition, high reliability can be expected because the entire module is hermetically sealed.

Figure 4:
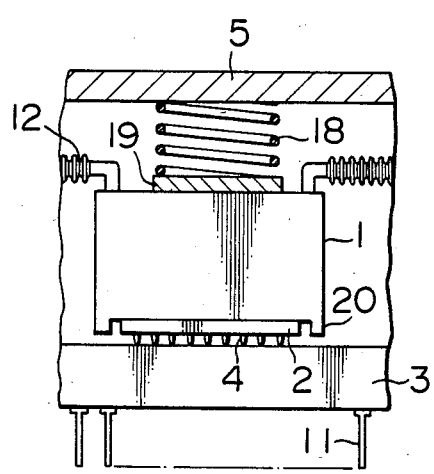
FIG. 4 is a partial sectional view for illustrating a principal part of another embodiment of the present invention.

Although in the embodiment illustrated in FIG. 3 the insulator 13 is bound to the chip 2 by soldering, it is also possible to press the cooling member 1 against the chip 2 by using a spring 18 as illustrated in FIG. 4. One end of the spring 18 is bound to the inside of the cap 5 while the other end of the spring 18 is bound to a holding plate 19. The surface of the holding plate 19 is contiguous to the upper surface of the cooling member 1 to press the cooling member 2 against the chip 1. In this embodiment, on the periphery of the bottom surface of the cooling member 1, i.e., the bottom surface of the insulator 13 or the bottom surface of the cooling block 14 in the absence of the insulator 13, a projection 20 is so provided as to surround the chip 2 for the purpose of positioning. In this embodiment, chip replacement can be more easily effected. In this case, it is possible to reduce the thermal contact resistance between the cooling member (or insulator) and the chip by enclosing gas such as helium having a high thermal conductivity into the module.

Figure 5:
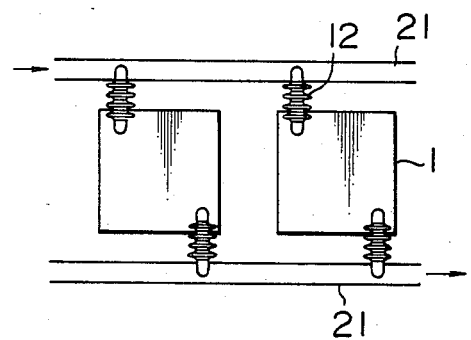
FIG. 5 is a plan view for illustrating a principal part of still another embodiment.

Although the cooling blocks are serially connected through bellows 12 in the embodiments illustrated in FIG. 3 and FIG. 4, they can also be connected in parallel as illustrated in FIG. 5. This configuration reduces the temperature rise of the coolant as compared with the embodiments illustrated in FIG. 3 and FIG. 4. A pipe 21 illustrated in FIG. 5 is connected to the nozzles 10a and 10b as illustrated in FIG. 1.

In summary, according to the present invention, the coolant is caused to flow into or out of respective cooling blocks through flexible pipes. The circulating path of the coolant can be arbitrarily altered.

In the above described embodiments, the insulator is provided between the cooling block and the chip. When the back surface of the chip has the ground potential, or the cooling block is made of an electrically insulating material such as the above described insulating silicon carbide having a high thermal conductivity, the insulator may be removed.

Although in the above described embodiments controlled collapse bonding through soldering terminals 4 is used to connect the integrated circuit chip 2 to the wiring substrate 3, wire bonding or tape automated bonding may also be used.

In accordance with the present invention, it is thus possible to significantly reduce the thermal resistance of the thermal conduction path between the chip and the coolant because the path is short and is composed of materials having favorable thermal conductivity. Thus, even an integrated circuit chip of high power dissipation can be efficiently and sufficiently cooled down. Unevenness in height of chips or tilt of a chip caused by the warp of the wiring substrate or unevenness in height of soldering terminals does not affect the thermal resistance, resulting in stable and efficient cooling. In addition, the chip replacement can be easily carried out. Since the chip can be electrically insulated from the cooling member, the normal operation of the circuit in the chip is ensured. In addition, the thermal stress applied to the chip can be reduced because the thermal expansion coefficient of the insulator can be made equal to that of the chip.

We claim:

1. A cooling module for integrated circuit chips comprising:
   a plurality of integrated circuit chips mounted on a wiring substrate;
   cooling members, one provided for each of said integrated circuit chips in heat conductive relationship therewith, each of said cooling members having therein space in which to circulate a coolant; and
   flexible pipes connected to their associated cooling members, said coolant being caused to flow into or out of the spaces of said cooling members through said pipes.

2. A cooling module for integrated circuit chips according to claim 1, wherein each said cooling member comprises a cooling block having said space and comprises fins provided in said space in thermal contact with said cooling block.

3. A cooling module for integrated circuit chips according to claim 2, wherein said fins of said cooling block are formed integrally with that plate of said cooling block at which the associated integrated chip is attached to said cooling block.

4. A cooling module for integrated circuit chips according to claim 2, wherein each said cooling block is made of an electrically insulating material having a high thermal conductivity.

5. A cooling module for integrated circuit chips according to claim 4, wherein each said cooling block is made of silicon carbide.

6. A cooling module for integrated circuit chips according to claim 2, further comprising a plane plate provided between each said cooling member and each said integrated circuit chip, each said plane plate being made of an electrically insulating material having a high thermal conductivity.

7. A cooling module for integrated circuit chips according to claim 6, wherein each said plane plate is made of silicon carbide.

8. A cooling module for integrated circuit chips according to claim 2, wherein a projection is so provided on the surface of each said cooling block confronting said integrated circuit chip as to surround each said integrated circuit chip.

9. A cooling module for integrated circuit chips according to claim 6, wherein a projection is so provided on the surface of each said plane plate confronting each said integrated circuit chip as to surround said integrated circuit chip.

10. A cooling module for integrated circuit chips according to claim 1, wherein said cooling members are arranged in a predetermined direction and are successively connected through said pipes.

11. A cooling module for integrated circuit chips according to claim 10, wherein each of said cooling members is coupled to its associated pipes by a metal fitting made of a shape memory alloy.

12. A cooling module for integrated circuit chips according to claim 1, further comprising a path for causing said coolant to flow into or out of each said module, said path being extended in a predetermined direction, said cooling members being coupled to said path through said pipes.

13. A cooling module for integrated circuit chips according to claim 1, further comprising spring means pressing said cooling members against said integrated circuit chips.

14. A multichip module comprising:
    a wiring substrate mounting and interconnecting a plurality of integrated circuit chips;
    cooling members, one provided for each of said integrated circuit chips in heat conducting relationship therewith, each of said cooling members having therein space in which to circulate a coolant;
    a casing having an opening in which is located at least said integrated circuit chips and said cooling members, one end of said opening being closed by a cap;
    a flange sealing a gap between said casing and said wiring substrate in order to hermetically seal said opening; and
    flexible pipes connected to their associated cooling members, said coolant being caused to flow into and out of each said space of each said cooling member through said pipes.

15. A multichip module according to claim 14, wherein each said cooling member comprises a cooling block having said space and comprises fins so provided in said space as to be in thermal contact with said cooling block.

16. A multichip module according to claim 14, further comprising plane plates, each of said plane plates being provided between each said cooling members and the associated integrated circuit chip, each of said plane plates being made of an electrically insulating material having a high thermal conductivity.

17. A multichip module according to claim 14, wherein said integrated circuit chips are arranged in a matrix form, and said cooling members are located along a predetermined direction and are successively connected through said pipes.

* * * * *